United States Patent
Knauer

(10) Patent No.: US 6,900,649 B1
(45) Date of Patent: May 31, 2005

(54) HIGH FREQUENCY RF INTERCONNECT FOR SEMICONDUCTOR AUTOMATIC TEST EQUIPMENT

(75) Inventor: William Knauer, Chagrin Falls, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 10/669,585

(22) Filed: Sep. 23, 2003

(51) Int. Cl.[7] .............................................. G01R 31/02
(52) U.S. Cl. ................................... 324/758; 324/158.1
(58) Field of Search ................................ 324/758, 765, 324/754, 763, 158.1, 755, 757, 72.5

(56) References Cited

U.S. PATENT DOCUMENTS

| | | | |
|---|---|---|---|
| 3,094,364 A | 6/1963 | Lingg | |
| 4,105,970 A | 8/1978 | Katz | |
| 4,307,928 A | 12/1981 | Petlock, Jr. | |
| 4,665,360 A | * 5/1987 | Phillips | ...................... 324/754 |
| 4,795,977 A | * 1/1989 | Frost et al. | .................. 324/537 |
| 5,511,304 A | 4/1996 | Aksu | |
| 5,558,541 A | * 9/1996 | Botka et al. | ................. 439/675 |
| 5,746,617 A | 5/1998 | Porter, Jr. et al. | |
| 5,879,176 A | 3/1999 | Stimson | |
| 5,969,535 A | 10/1999 | Saito | |
| 6,211,690 B1 | 4/2001 | Fjelstad | |
| 6,224,421 B1 | 5/2001 | Maturo, Jr. | |
| 6,305,230 B1 | * 10/2001 | Kasukabe et al. | ............ 73/855 |
| 6,344,736 B1 | 2/2002 | Kerrigan et al. | |
| 6,402,549 B1 | 6/2002 | Ayres et al. | |
| 6,407,562 B1 | 6/2002 | Whiteman | |
| 6,414,504 B2 | 7/2002 | Johnston | |
| 6,424,163 B1 | 7/2002 | Ott | |
| 6,441,632 B1 | 8/2002 | Correia et al. | |

* cited by examiner

Primary Examiner—David Zarneke
Assistant Examiner—Jimmy Nguyen
(74) Attorney, Agent, or Firm—Pearne & Gordon LLP

(57) ABSTRACT

A RF test interconnection system for connecting a measurement device to a device under test includes, a probe card having a probe extending from a first side of the card for making electrical contact with the device under test and a coaxial connector extending from a second side of the card, a test head having a test head coaxial connector that will mate with the probe card coaxial connector when the probe card and the test head are urged together, and a de-mating device attached to either the probe card or the test head for urging the probe card and the test head apart by applying a separating force therebetween. The probe card and the test card coaxial connectors are electrically connected when the test head and the probe card are urged together by a connection force and electrically disconnected when the connection force is removed.

12 Claims, 6 Drawing Sheets

US 6,900,649 B1

HIGH FREQUENCY RF INTERCONNECT FOR SEMICONDUCTOR AUTOMATIC TEST EQUIPMENT

BACKGROUND OF THE INVENTION

The present invention relates to automatic test equipment and, in particular, to a radio frequency interconnection system for use in connecting a device under test to a measurement device.

Semiconductor devices are often tested by test equipment that includes a probe card that is configured with fine probes that make electrical contact with desired points on the semiconductor device. A differently configured probe card can be used for different semiconductor devices. The probe card is then mated with a test head that is typically able to mate with the differently configured probe cards in a uniform manner. The test head either includes or is connected to the measurement devices required to perform the desired tests on the semiconductor devices.

When a different semiconductor device is to be tested, it is desirable to "drop-in" the appropriate probe card into the test equipment and connect the test head to the probe card.

For non-RF testing, various satisfactory ways of connecting the probe card to the test head have been developed. U.S. Pat. No. 5,808,475 shows a probe card and test head connection scheme and is incorporated herein by reference. These techniques have proven unsatisfactory for RF testing because of the tendency for the RF energy to radiate. For RF testing, coaxial cables and connectors are desirable for controlling RF radiation. However, existing RF connection systems are not suitable for the quick and simple connection desired for the use of "drop-in" probe cards.

SUMMARY OF THE INVENTION

A RF test interconnection system for connecting a measurement device to a device under test includes, a probe card having a probe extending from a first side of the card for making electrical contact with the device under test and a coaxial connector extending from a second side of the card, a test head having a test head coaxial connector that will mate with the probe card coaxial connector when the probe card and the test head are urged together, and a de-mating device attached to either the probe card or the test head for urging the probe card and the test head apart by applying a separating force therebetween. The probe card and the test card coaxial connectors are electrically connected when the test head and the probe card are urged together by a connection force and electrically disconnected when the connection force is removed.

DESCRIPTION OF THE PREFERRED EMBODIMENTS

Figure 1:
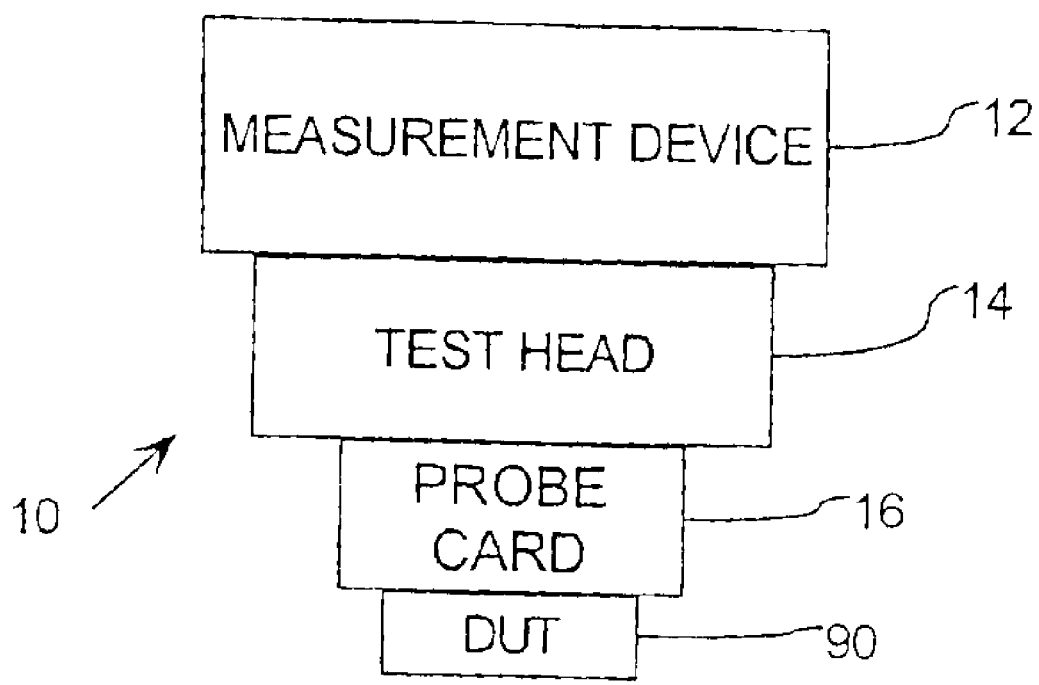
FIG. 1 is a block diagram of a semiconductor tester according to the invention.

Referring to FIG. 1, a semiconductor device tester 10 for performing tests on semiconductor device includes a measurement device 12, a test head 14 and a probe card 16. The measurement device 10 performs electrical measurements on the device under test (DUT) 90.

In operation, the tester 10 is configured such that the DUT 90 is placed under the probe card 16 which contains fine electrical probes that contact points of interest on the DUT 90. Different probe cards may be conveniently configured to have probes that are arranged for different DUTs. The bottom portion of the probe card 16 has a selection and pattern of probes. The top portion of the probe card 16 has connectors that mate with the test head 14 in a more standard arrangement then that of the probes. The measurement device 12 is either contained within the test head 16 itself or is electrically connected thereto.

To allow for the rapid, trouble-free, reconfiguration of the tester 10 for the testing of a different DUT or to otherwise use a different probe card 16, it has been found to be desirable to be able to retract the test head 12 from the probe card 16 and to lift the probe card 16 out of an unshown carrier. A new probe card 16 is "dropped" into the tester 10 and the test head 12 again mated with the probe card 16.

Figure 2:
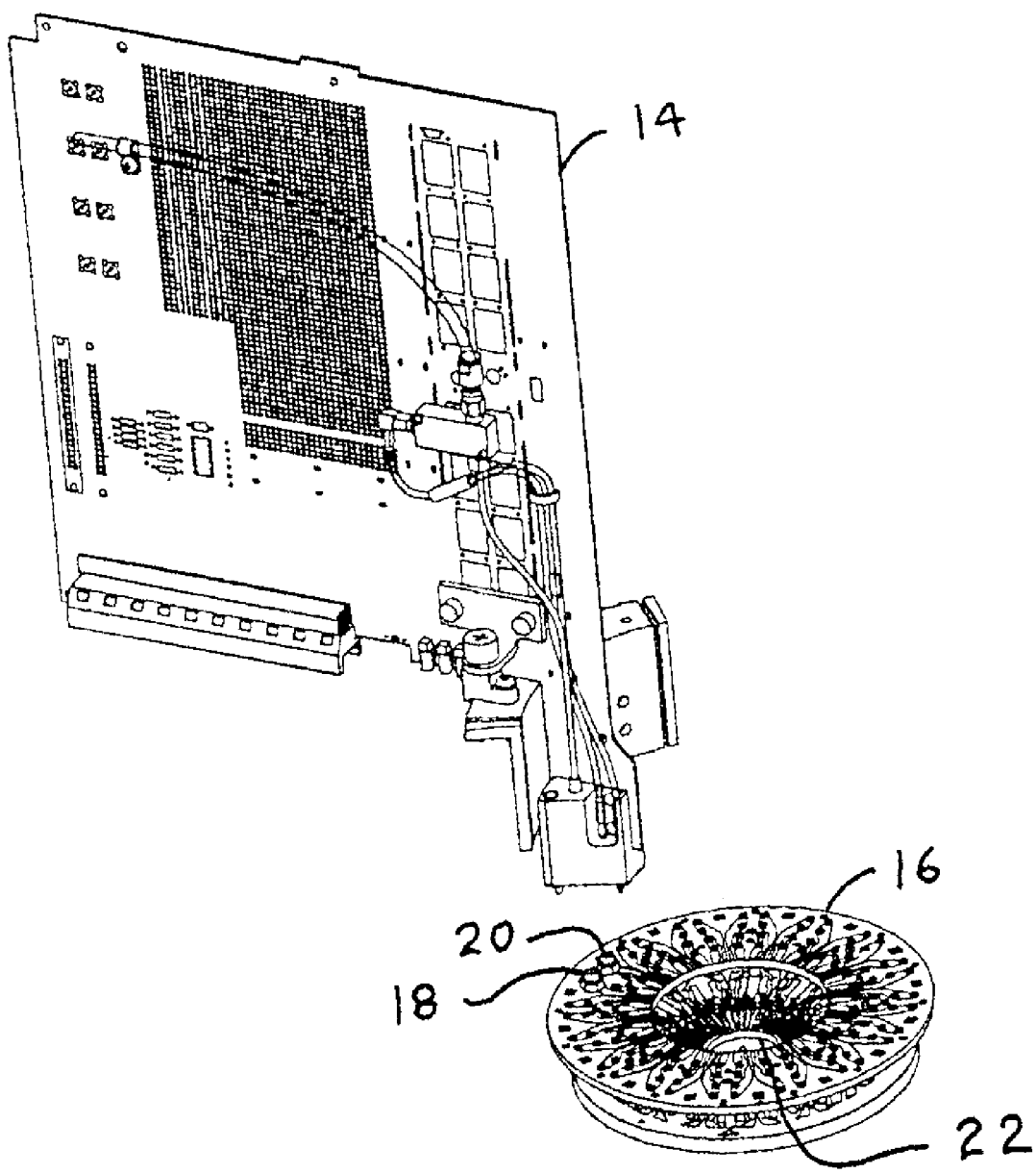
FIG. 2 is a perspective view of a probe card and a test head according to the invention.

Referring to FIG. 2, when RF (e.g., frequencies up to 60 GHz) measurements are desired, a test head 14 and a probe card 16 may be used that include coaxial connectors 18, 20. The test head 14 and the probe card 16 are shown without their support structures for ease of understanding. It also should be understood that one or more additional test heads may also be arranged in a radial blade-like fashion above the probe card. These test heads may be referred to collectively as a test head as well, as they are typically all mounted to a common support structure. The central aperture 22 in the probe card 16 contains the fine probes (not visible) for making contact with the DUT 90.

Figure 3:
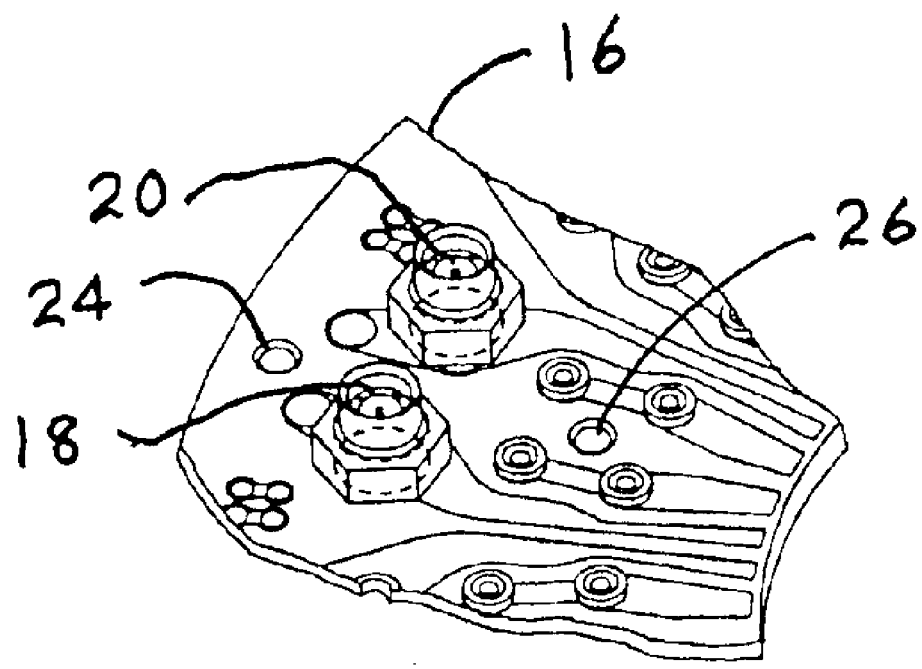
FIG. 3 is a perspective view of a portion of a probe card according to the invention.

Referring to FIG. 3, a portion of the probe card 16 that mates with the test head 14 includes the coaxial connectors 18, 20 and alignment apertures 24, 26. The apertures 24, 26 may advantageously be tapered to assist in aligning the test head 14 to the probe card 16 as more fully explained below.

Figure 4:
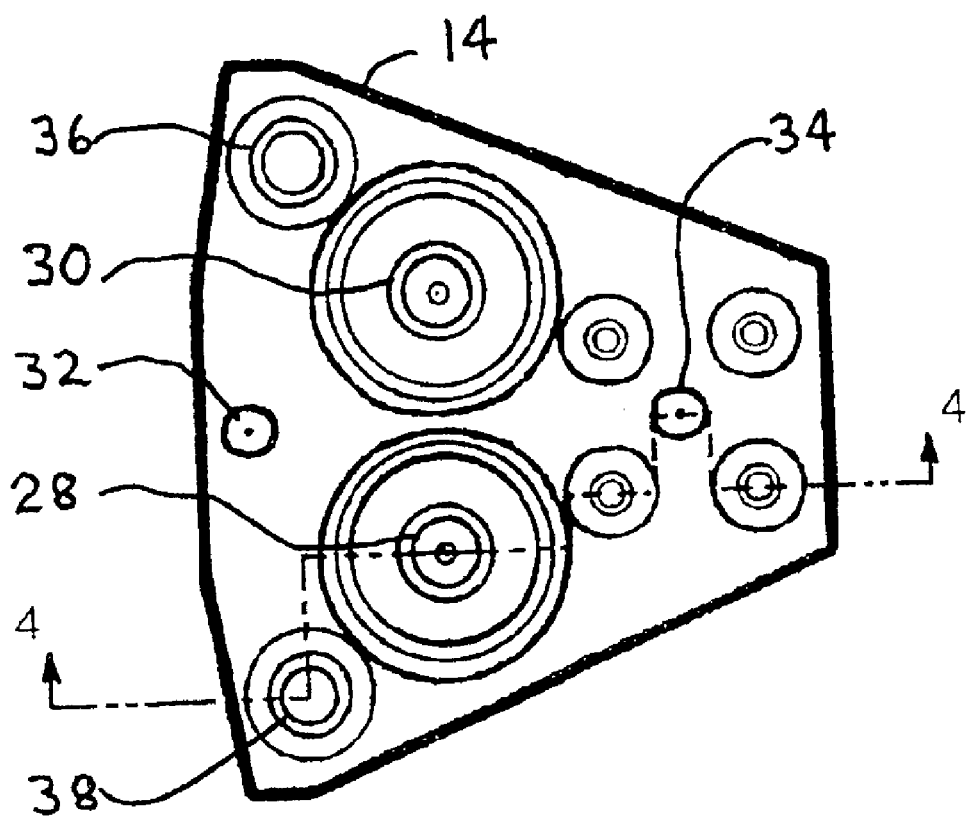
FIG. 4 is a bottom view of the mating portion of a test head according to the invention.

Referring to FIG. 4, the bottom surface of the test head 14 that mates with the probe card 16 includes the coaxial connectors 28, 30, the alignment pins 32, 34 and the de-mating devices 36, 38. The alignment pins 32, 34 may be advantageously tapered to assist in aligning the test head 14 with the probe card 16.

In the preferred embodiment, the de-mating devices 36, 38 are spring-loaded plungers, but other devices could be used such as electrical solenoids, cams, fluid-powered actuators and the like.

Figure 5:
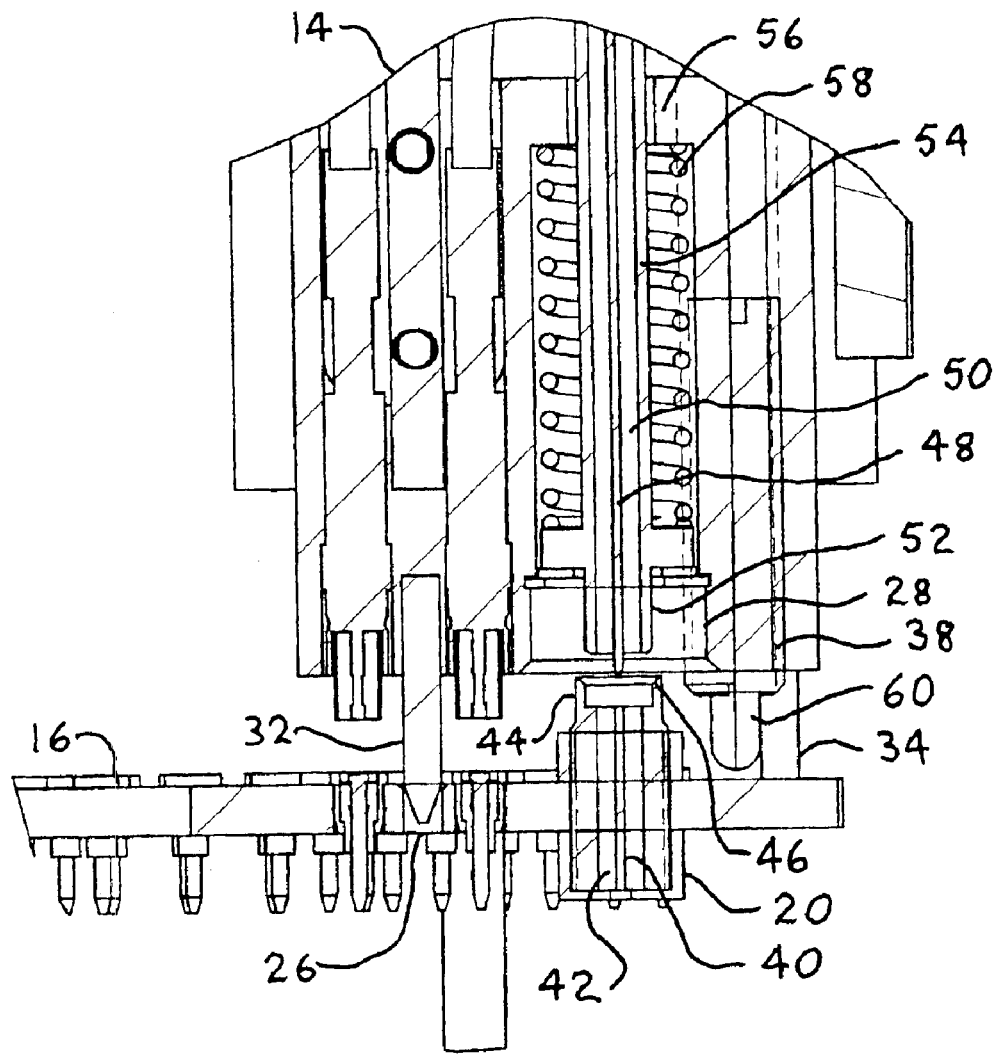
FIG. 5 is a cross section view along the line 4—4 of FIG. 4 wherein the test head and the probe card are starting to mate.

Referring to FIG. 5, the mating portions of the test head 14 and the probe card 16 are shown in cross section along the line 4—4 of FIG. 4 as the portions start to mate. The alignment pin 32 has entered the alignment aperture 26 and the alignment pin 34 has entered the alignment aperture 24 (not visible).

The coaxial connector 20 has inner conductive female receptacle 40, an insulating sleeve 42 and an outer conductive female barrel 44. The barrel 44 may advantageously include a tapered mouth 46 to aid in alignment during mating.

The coaxial connector 28 has a male conductive center pin 48, an insulating sleeve 50 and an outer conductive male barrel 52. The pin 48 may advantageously be pointed and tip of the barrel 52 tapered to aid in alignment. The pin 48, sleeve 50 and barrel 52 form a unit 54 that is retained within an enclosure 56. The unit 54 is biased towards the probe card 16 by a compression member such as the spring 58 within the enclosure 56.

Figure 6:
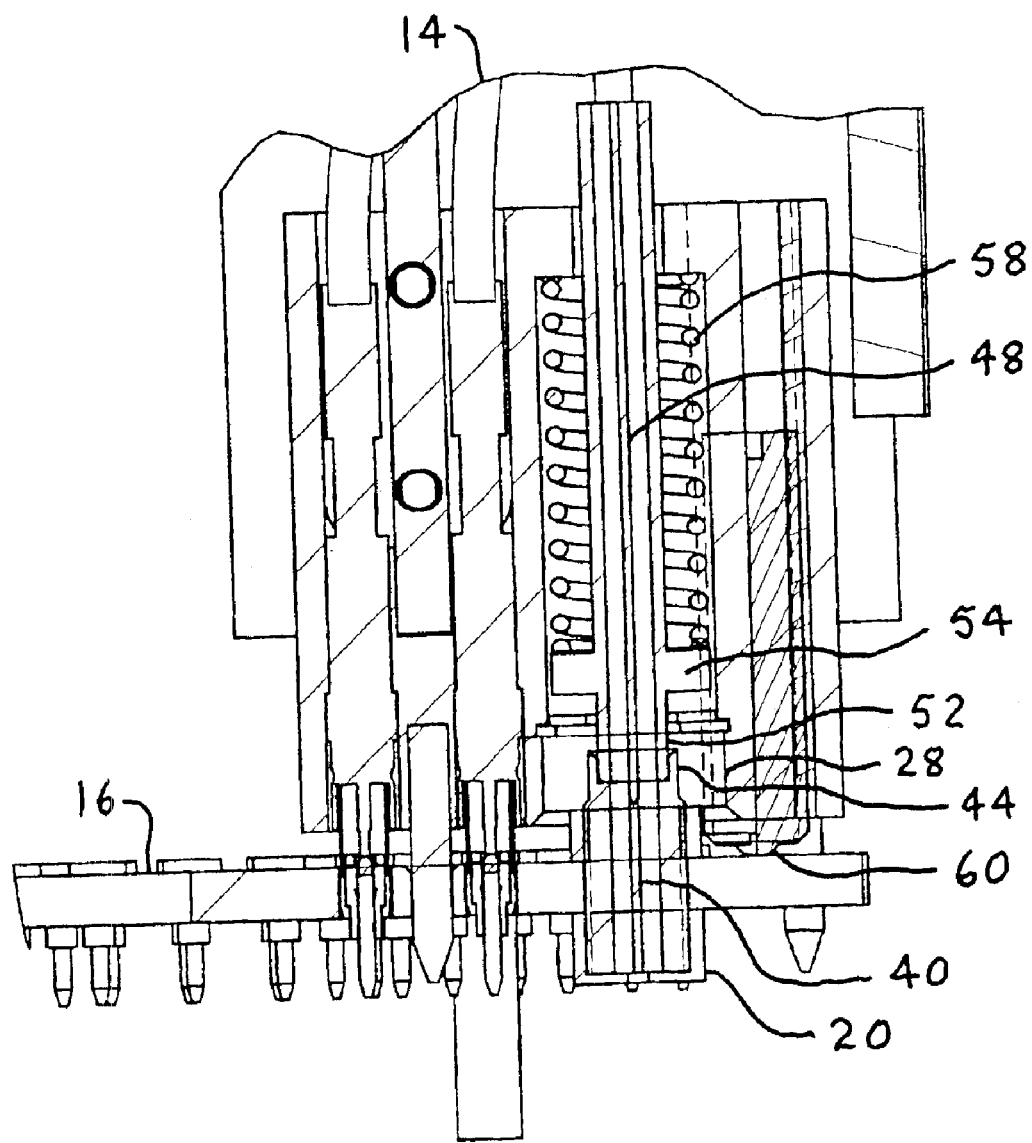
FIG. 6 is a cross section along the line 4—4 of FIG. 4 wherein the test head and the probe card are fully mated.

Referring to FIG. 6, the mating portion of the test head 14 and the probe card 16 are shown in cross section along the line 4–4 of FIG. 4 when the portions are fully mated. This mating is produced by an unshown mechanism that urges the test head 14 and the probe card 16 together to produce a functioning tester 10.

The connector 28 is fully seated in the connector 20 and the unit 54 has been displaced against the compressive force of the spring 58 to provide a firm, constant, connection. The pin 48 has slid into the receptacle 40 and the barrel 52 has slid into and seated in the barrel 44.

In addition, the plunger 60 of the de-mating device 38 has been forced into the device 38 by pressure against the probe card 16. Similarly, the unshown plunger of the de-mating device 36 has been forced into the device 36.

The sliding mating of the connectors 18, 20, 28, 30, as well as to a lesser degree, the pins 32, 34 and apertures 24, 26 provide substantial resistance to the de-mating of the test head 14 from the probe card 16. The de-mating devices 36, 38 overcome this resistance when the test head 14 is lifted up from the tester 10. Without the devices 36, 38, the probe card 16 would either stay attached to the test head 14, or worse, fall off suddenly, causing damage.

The present invention provides the ability to use "drop-in" probe cards for RF measurements. There is no need to manually make RF connections with each probe card change. The probe card is positively released merely by retracting the test head, without danger of the probe card "sticking" to the test head.

It should be noted that, in general, male and female components and the de-mating devices can be reversed with respect to their locations on the test head and the probe card.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A RF test interconnection system for connecting a measurement device to a device under test, said system comprising:
   a probe card having a probe extending from a first side of said probe card for making electrical contact with said device under test and a probe card coaxial connector extending from a second side of said probe card, said probe and said probe card coaxial connector being in electrical communication;
   a test head having a test head coaxial connector adapted to mate with said probe card coaxial connector when said probe card and said test head are urged together, said test head coaxial connector being connectable to said measurement device; and
   a de-mating device attached to one of said probe card and said test head for urging said probe card and said test head apart by applying a separating force therebetween, said probe card and said test card coaxial connectors being electrically connected when said test head and said probe card are urged together by a connection force and electrically disconnected when said connection force is removed.

2. A system according to claim 1, wherein said de-mating device is a spring-loaded plunger.

3. A system according to claim 1, wherein said de-mating device is attached to said test head.

4. A system according to claim 1, wherein said probe card coaxial connector includes a female inner receptacle and a female outer barrel and said test head coaxial connector includes a male center pin and a male outer barrel, said receptacle and pin slidingly mating when said probe card and test head are urged together and said male and female barrels slidingly mating when said probe card and said test head are urged together.

5. A system according to claim 1, wherein said coaxial connectors include a compression member that maintains compressive contact between the connectors when said probe card and said test head are urged together.

6. A system according to claim 1, further comprising tapering male extensions cooperating with female receptors to assist in aligning said connectors.

7. A system according to claim 1, further comprising tapering female receptors cooperating with male extensions to align said connectors.

8. A RF test interconnection system for connecting a measurement device to a device under test, said system comprising:
   a probe card having a probe extending from a first side of said probe card for making electrical contact with said device under test and a probe card coaxial connector extending from a second side of said probe card, said probe and said probe card coaxial connector being in electrical communication and said probe card coaxial connector includes a female inner receptacle and a female outer barrel;
   a test head having a test head coaxial connector adapted to mate with said probe card coaxial connector when said probe card and said test head are urged together, said test head coaxial connector being connectable to said measurement device and said test head coaxial connector includes a male center pin and a male outer barrel; and
   a spring-loaded plunger attached to one of said probe card and said test head for urging said probe card and said test head apart by applying a separating force therebetween, said probe card and said test card coaxial connectors being electrically connected when said test head and said probe card are urged together by a connection force and electrically disconnected when said connection force is removed, wherein said receptacle and pin slidingly mate when said probe card and test head are urged together and said male and female barrels slidingly mate when said probe card and said test head are urged together.

9. A system according to claim 8, wherein said plunger is attached to said test head.

10. A system according to claim 8, wherein said coaxial connectors include a compression member that maintains compressive contact between the connectors when said probe card and said test head are urged together.

11. A system according to claim 8, further comprising tapering male extensions cooperating with female receptors to align said connectors.

12. A system according to claim 8, further comprising tapering female receptors cooperating with mail extensions to align said connectors.

* * * * *

UNITED STATES PATENT AND TRADEMARK OFFICE
CERTIFICATE OF CORRECTION

PATENT NO. : 6,900,649 B1
DATED : May 31, 2005
INVENTOR(S) : Knauer, William

It is certified that error appears in the above-identified patent and that said Letters Patent is hereby corrected as shown below:

<u>Title page,</u>
Item [56], References Cited, U.S. PATENT DOCUMENTS, insert:
-- 2001/0050571    12/01    Johnston
   2002/0063566    5/02     Buno et al.
   2002/0093355    7/02     Parker et al. --.

Signed and Sealed this

Seventh Day of February, 2006

JON W. DUDAS
*Director of the United States Patent and Trademark Office*